(12) United States Patent
Abdel-Dayem et al.

(10) Patent No.: US 12,132,028 B2
(45) Date of Patent: Oct. 29, 2024

(54) SEMICONDUCTOR PACKAGE WITH CAPACITANCE DIE

(71) Applicant: Amazon Technologies, Inc., Seattle, WA (US)

(72) Inventors: Bassam Abdel-Dayem, Santa Clara, CA (US); Thomas A. Volpe, Austin, TX (US)

(73) Assignee: Amazon Technologies, Inc., Seattle, WA (US)

( * ) Notice: Subject to any disclaimer, the term of this patent is extended or adjusted under 35 U.S.C. 154(b) by 281 days.

(21) Appl. No.: 17/698,976

(22) Filed: Mar. 18, 2022

(65) Prior Publication Data

US 2023/0299045 A1    Sep. 21, 2023

(51) Int. Cl.
| | |
|---|---|
| *H01L 25/065* | (2023.01) |
| *H01L 23/538* | (2006.01) |
| *H01L 23/64* | (2006.01) |
| *H01L 25/00* | (2006.01) |

(52) U.S. Cl.
CPC ...... *H01L 25/0655* (2013.01); *H01L 23/5386* (2013.01); *H01L 23/642* (2013.01); *H01L 25/50* (2013.01)

(58) Field of Classification Search
CPC ............. H01L 25/0655; H01L 23/5386; H01L 23/642; H01L 25/50; H01L 23/5385
See application file for complete search history.

(56) References Cited

U.S. PATENT DOCUMENTS

| | | | |
|---|---|---|---|
| 2020/0303344 A1* | 9/2020 | Manipatruni | G11C 11/419 |
| 2020/0365572 A1 | 11/2020 | Su et al. | |
| 2020/0373256 A1 | 11/2020 | Yook et al. | |
| 2021/0193567 A1* | 6/2021 | Cheah | H01L 23/5385 |
| 2021/0249952 A1* | 8/2021 | Roth | H01L 25/18 |
| 2023/0060727 A1* | 3/2023 | Radhakrishnan | H01L 24/73 |
| 2023/0163098 A1* | 5/2023 | Elsherbini | H01L 25/0652 257/532 |

OTHER PUBLICATIONS

Lin et al., "High Reliability Solution of 2.5D Package Technologies", IEEE 23rd Electronics Packaging Technology Conference (EPTC), 2021, pp. 620-623.
PCT/US2023/015108 , "International Search Report and Written Opinion", Jul. 10, 2023, 10 pages.

* cited by examiner

*Primary Examiner* — Thao P Le
(74) *Attorney, Agent, or Firm* — Kilpatrick Townsend & Stockton LLP (57) ABSTRACT

A semiconductor package can include a capacitance die. The package can have multiple dice (e.g., logic die, memory die) mounted on a substrate. Each die can include a power domain. The dice can be distributed on the substrate such that an extra space is present on the substrate between at least some of the dice. For example, an extra space may be present between two dice, at a corner of the substrate, or other locations. The extra space can disrupt a coplanarity of the semiconductor package. The capacitance die can be located in the extra space so as to establish the coplanarity with the other dice. The capacitance die can include a capacitor array electrically coupled to multiple power domains of the plurality of dice.

20 Claims, 6 Drawing Sheets

SEMICONDUCTOR PACKAGE WITH CAPACITANCE DIE

BACKGROUND

In semiconductor manufacturing, a package may correspond to a suitable container and/or assembly for holding a semiconductor die. The package may protect the die, dissipate heat, connect the die to other dice or components, and/or perform other important functions.

With advancements in technology, compact and small electronic circuits with increased functionality are desired. As such, sizing of components and/or spacing among components can be important factors in semiconductor packages. For example, components are often manufactured separately and assembled together such that the semiconductor dice are placed side-by-side or stacked on top of each other with interconnections between each other. In addition, foundries or other producers may have particular rules about minimum spacing that may be permitted between respective components, such as to facilitate fabrication, for example. Designs of packages accordingly may often be constrained by sizing and/or spacing considerations.

BRIEF DESCRIPTION OF THE DRAWINGS

Various embodiments in accordance with the present disclosure will be described with reference to the drawings, in which.

DETAILED DESCRIPTION

To satisfy increasing demands in chip functionality, chip-on-wafer-on-substrate (COWOS) technology such as 2.5D or 3D COWOS technology has emerged as an area for ongoing development. The COWOS technology typically involves multiple dice assembled one above another or adjacent to each other to achieve better interconnect and performance of the chip. For example, 2.5D or 3D COWOS assemblies may include a logical die or multiple logical dice, as well as a single memory die (e.g., high-bandwidth memory (HBM)) or multiple number of memory dice (e.g., HBMs), all of which may be arranged next to each other and/or stacked on each other.

In COWOS, coplanarity can be a relevant factor for correct assembly on the interposer structures. To meet coplanarity specifications of the structures, a placeholder die or dice may be placed on the structure so that the overall structure has a satisfactory coplanarity. However, such a placeholder die or dice may occupy space without adding any computational benefit. To better utilize the space, a capacitance die can be installed, e.g., in accordance with examples described herein.

Various examples described herein are directed to systems or techniques relating to semiconductor packages. The semiconductor packages may include several dice, also referred as chips, including a capacitance die mounted in a specified area of a substrate. The capacitance die may include a set of capacitors, e.g., which may permit various operating performance functions of devices employing the semiconductor package. The capacitance die may also be arranged to facilitate coplanarity among mounted dice, e.g., which may be useful in resisting warpage or otherwise enhancing structural stability for the package.

In some cases, computational dice on the substrate may be of different sizes, which when placed within a specified area, may leave an extra space on the substrate. For example, the computational dice may be one or more logic dice, one or more memory dice, etc. distributed on the substrate such that there is an extra space. An extra space may be a space between two dice, at a corner of the substrate, or other locations on the substrate. The capacitance die may be placed in such an extra die space on the semiconductor package to improve coplanarity. Furthermore, capacitors of the capacitance die may be electrically connected to the other dice in the semiconductor package to support power specifications of the respective dice. Thus, the capacitance die may enhance structural integrity as well as operating performance of the semiconductor package.

The capacitance die may include multiple capacitors per capacitance die. The multiple capacitors may be arranged in different form factors. For example, the multiple capacitors may be arranged as a capacitor array. For example, the capacitor array may be arranged in rows and columns within a die (e.g., 3 rows and 3 columns, 4 rows and 5 columns, etc.). Some capacitors within the array may have one capacitance value and other capacitors within the array may have another capacitance value. The capacitors may be electrically coupled to multiple power domains of the dice in the semiconductor package. For example, a first capacitor of the capacitance die may be connected to a power domain of a die, and a second capacitor of the capacitance die may be connected to another power domain of the same or different die. The capacitance die can increase the capacitance density of the semiconductor package multifold compared to arrangements lacking a capacitance die.

The capacitance die may provide several advantages in addition to facilitating coplanarity of the semiconductor package. For example, the capacitance die may facilitate shorter connections with the computational dice compared to capacitance elements located outside the die area. The capacitance die may facilitate connections with low resistance and low impedance compared to connections with capacitors located outside the die area. The low impedance and low resistance of the short connections can advantageously reduce noise during computation. The capacitance die can supplement power requirements of power domains of the computational dice to facilitate faster computation speed compared to arrangements lacking a capacitance die. The capacitance die can be configured to combine multiple capacitors within the capacitance die to satisfy capacitance specifications associated with different power domains on the same substrate. This may increase the capacitance density of the semiconductor device multifold compared to the semiconductor device lacking the capacitance die or having only a placeholder die.

In some embodiments, the dice of the semiconductor package may be mounted on the substrate via an interposer positioned between the dice and the substrate. The capacitance die may be connected to one or more power domains of the dice via the interposer. Accordingly, the interposer may include interconnections to electrically couple the capacitors of the capacitance die to power domains of the dice on the semiconductor package.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Figure 1:
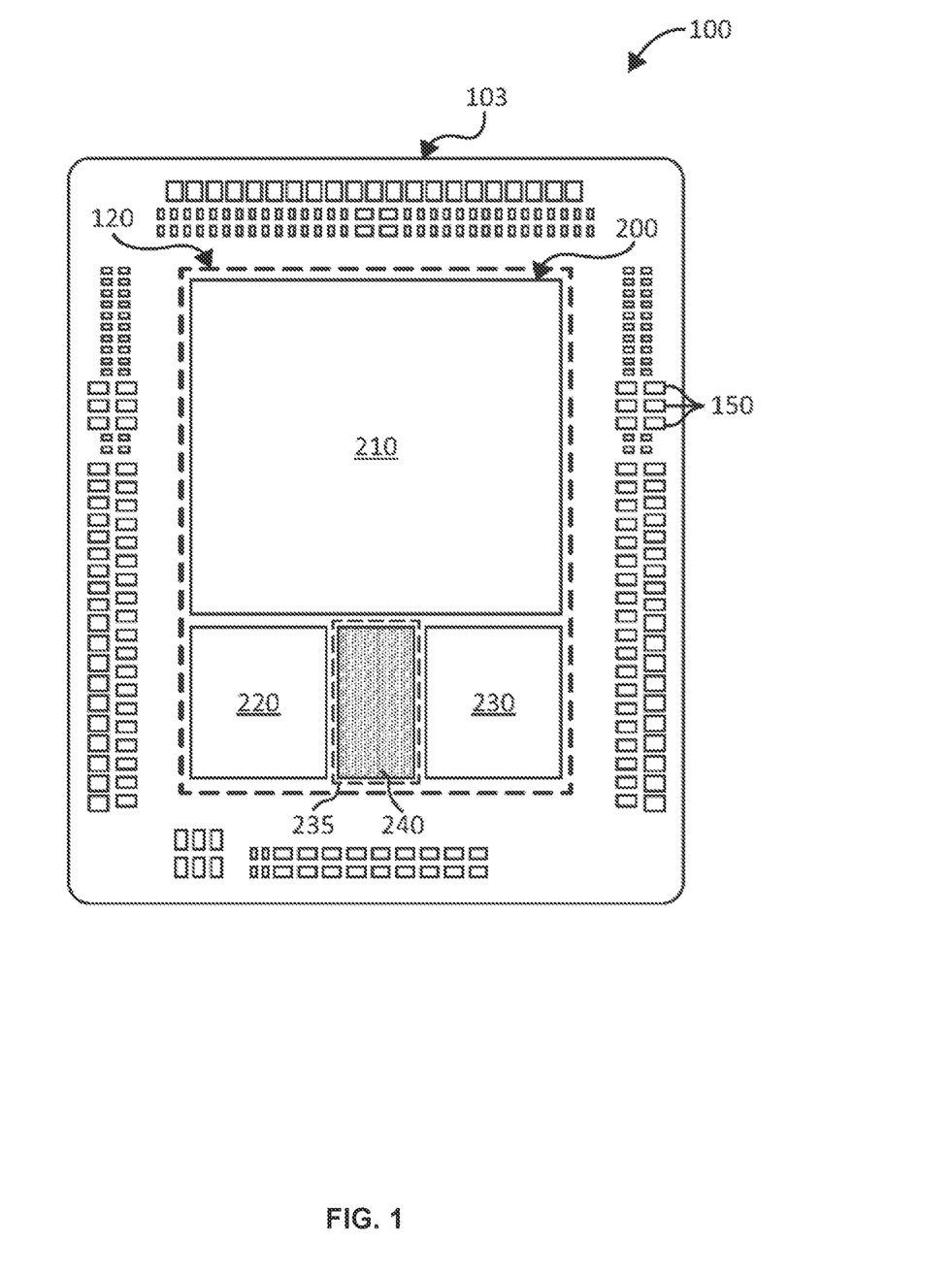
FIG. 1 illustrates a top view of a semiconductor package in accordance with various embodiments.

FIG. 1 is a top view of an example of a semiconductor package 100 in an assembled state. The semiconductor package 100 includes a substrate 103. The substrate 103 includes a die area 120. Additional electrical components 150 can be arranged on the substrate 103 outside of the die area 120. For example, the die area 120 may be at least partially surrounded by several electrical components 150, according to some embodiments.

Within the die area 120 on the substrate 103, the semiconductor package 100 can include a plurality of dice 200 (e.g., individually identified by reference numbers 210, 220, 230, and 240 by way of example in FIG. 1). The plurality of dice 200 are typically connected to each other to perform specified functions (e.g., high speed computation, training a machine learning model, networking, communication, etc.) of the semiconductor package. Surrounding the die area 120, several electrical components 150 (e.g., capacitors) may be arranged. In some embodiments, one or more of these capacitors or other electrical components 150 may be electrically coupled to the plurality of dice 200 through the substrate 103 to satisfy power specifications of the semiconductor package 100.

The plurality of dice 200 may be arranged to facilitate or establish co-planarity. For example, as shown in FIG. 1, the plurality of dice 200 can include a first die 210, a second die 220, and a third die 230 that are assembled such that a top surface of the dice 210, 220, and 230 are coplanar. In some examples, the dice 210, 220, and 230 may be of predetermined sizes, which when assembled within the die area 120, leaves an extra space 235, for example, between the second die 220 and the third die 230. The extra die space 235 if unoccupied may detrimentally affect coplanarity of the semiconductor package 100, which may increase a susceptibility of the semiconductor package 100 to mechanical warpage. The extra die space 235 may be large enough to accommodate a die (e.g., a size of a memory die). In some embodiments, the extra die space 235 is larger than a typical space left between adjacent dice for compact mounting on the substrate 103. In some embodiments, an extra die space 235 may be of a size greater than 100 μm up to 5 mm. As an example, where the gap along adjacent edges between a larger first die 210 and a smaller second die 220 may be on the order of 0.5 mm, the extra die space 235 may have a width of e.g., 2 mm, 2.8 mm, 5 mm between the second die 220 and the third die 230.

The term "coplanarity" as discussed herein may refer to surfaces or reference points of one or more dice mounted on a substrate being within a same plane. In some embodiments, the coplanarity may be associated with the top surfaces of the plurality of dice 200 (e.g., 210, 220, and/or 230). In some embodiments, the coplanarity may be associated with a bottom surface of the plurality of dice 200 (e.g., 210, 220, and/or 230). In use, deviation from—or incompleteness of—coplanarity may contribute to a susceptibility to mechanical warpage. Additionally or alternatively, distortion of coplanarity may break connections between the dice 200, e.g., which may negatively affect the operating performance of the semiconductor package 100.

To maintain and/or improve coplanarity, the extra die space 235 may be filled with—or at least partially occupied with—a placeholder die. The placeholder die can be any structural component configured to maintain, augment, or establish structural integrity of the semiconductor package, e.g., so that the dice 210, 220, and 230, or other components remain coplanar. However, such placeholder die may be non-functional or non-operational with respect to computational functions of the semiconductor package 100. In other words, the placeholder die may be not electrically coupled with the dice 210, 220, and 230.

In some embodiments, a capacitance die 240 may be assembled in the extra space 235. The capacitance die 240 may include an capacitor array disposed within a die form factor. For example, the capacitor array may be arranged in rows and columns within a die (e.g., 3 rows and 3 columns, 4 rows and 5 columns, etc.). The capacitors within the capacitance die 240 may have the same or different capacitance values from one another. For example, a first capacitor may have a first capacitance value and a second capacitor having a second capacitance value. The first capacitance value may be different from the second capacitance value.

Figure 2:
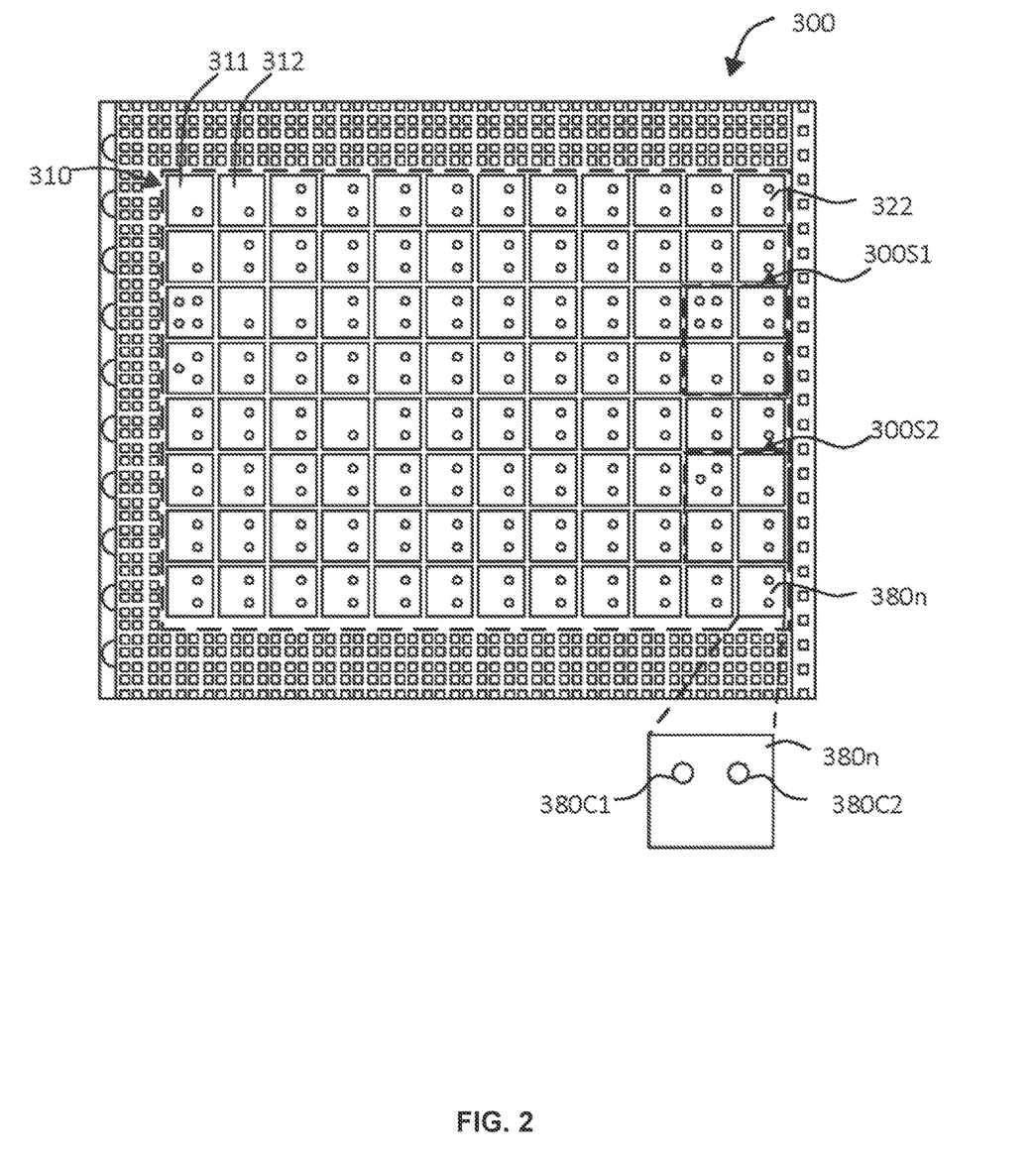
FIG. 2 illustrates an example of a capacitance die that may be utilized in the package of FIG. 1 in accordance with various embodiments.

FIG. 2 illustrates an example of a capacitance die 300 according to some embodiments. The capacitance die 300 may be an example of the capacitance die 240 (of FIG. 1) or may be otherwise suitable for use in the semiconductor package 100. The capacitance die 300 may include a capacitor array 310. The capacitor array 310 as depicted includes capacitor elements 311, 312, . . . , 322, . . . , 380n. In some embodiments, each capacitor element (e.g., 311, 312, . . . , 322, . . . , or 380n) may include one or more capacitors. For example, the capacitor element 380n is shown as including two capacitors 380C1 and 380C2, while some other capacitor elements are shown with other numbers of capacitors.

In some embodiments, the capacitance die 300 can be configured to combine multiple capacitors within the capacitance die 300, e.g., to satisfy capacitance specifications associated with different power domains on the same substrate. For example, one or more capacitors may be grouped into a first set of capacitors 300S1 and another one or more capacitors may be grouped into a second set of capacitors 300S2 to provide the same or different capacitance values. For example, the first set of capacitors 300S1 may provide a capacitance value in a range 1 μF-2 μF, and the second set of capacitors 300S2 may provide a capacitance value in a range 1 μF-2 μF. It can be understood that the capacitance values are only example and higher or lower capacitance values are possible. A total capacitance of the capacitance die 300 in some examples can be in a range 100 μF-200 μF. Such grouping of capacitors may increase the capacitance density of the semiconductor device multifold compared to the semiconductor device lacking capacitance die or having only a placeholder die.

In some embodiments, one or more capacitors of the capacitor array 310 may be decoupled from each other to decouple one part of a circuit on a die from another part of the circuit. This may allow noise caused by other circuit elements to be shunted through the decoupled capacitors. In addition, connections between the capacitors and the multiple power domains may have a length short enough and/or a low enough resistance and/or impedance to block, prevent, and/or reduce high frequency noise generated during operation (e.g., compared to much longer length connections between power domains and capacitors outside the die area 120). As such, the capacitance die can help to reduce noise that may be generated during high frequency computations.

The term "power domain" used herein may refer to an on-chip power domain associated with at least one die or chip. The power domains may be configured to supply or direct regulated power from a power source to one or more dice for various operations. For example, from a single power source, a power domain may draw a pre-determined current and voltage to support one or more operations of a first die (e.g., 210), and another power domain may draw another pre-determined current and voltage to support operations of a second die (e.g., 220). In some embodiments, multiple power domains may be provided that operate different dice or different portions of a die at different voltages. Running at a lower voltage can reduce power consumption, but at the expense of speed. Typically, a power domain may include a power rail structure that can be shared between different chips on a substrate to draw current from the power source, to turn power on or off to a particular die by the power domain, or other power management functions.

The power domain may include capacitors, a power management control logic (e.g., a sequence of power up and power down instructions), a voltage regulator, or other power management related components. Each power domain can have valid and pre-determined power states. In some embodiments, power domains can remain active even when all the chips are powered down. Generally, power domain specifications can vary for different dice, for different operating modes of the dice or the package as a whole, or other power-related factors.

In some embodiments, the capacitor array 310 may be electrically coupled to power domains of the plurality of dice (e.g., 200 in FIG. 1) within a die area (e.g., 120 in FIG. 1). For example, a capacitor of the first capacitor element 311 may be connected to a power domain of the first die 210, and a capacitor of a second capacitor element 312 may be connected to another power domain of the second die 220. In another example, the first set of capacitors 300S1 may be coupled to the first die 210 and the second set of capacitors 300S2 may be coupled to the second die 220. In yet another example, the second set of capacitors 300S2 may be further coupled to the third die 230. In some embodiments, the first set of capacitors 300S1 is configured to satisfy a first voltage specification of the first die 210 of the plurality of dice 200, and the second set of capacitors 300S2 is configured to satisfy a second voltage specification of a second die 220 of the plurality of dice 200.

In some embodiments, the capacitors of capacitance die 240 (or 300) may be formed as deep-trench or shallow trench capacitors. A deep trench may be formed using a patterning technique, such as for example, a lithography process followed by etching process. The term "trench" may denote a trench formed in a die having a sufficient depth to form a capacitor. For example, a deep trench may typically denote a trench having a depth equal to or greater than 1 micron, whereas a shallow trench may typically refer to a trench having a depth less than 1 micron. In some embodiments, the capacitance die 240 (or 300) may have a thickness configured to allow coplanarity with respect to the other components of the semiconductor package. Accordingly, the capacitance die 240/300 may include shallow or deep trench.

As discussed herein, the plurality of dice 200 may include two, three, four, or more dice disposed within the die area 120. The number of dice, die sizes, or type of dice discussed herein are only examples and do not limit the scope of the present disclosure. For example, the first die 210 maybe a logic die having a first size, the second die 220 and the third die 230 may be memory dice (e.g., high-bandwidth memory) having a second size. In another example, the plurality of dice 200 may include the first die 210, the second die 220, and the capacitance die 240 (e.g., which may be of differing relative sizes than depicted). The first die 210, the second die 220, and the capacitance die 240 may be sized to fit within the die area 120.

Figure 3:
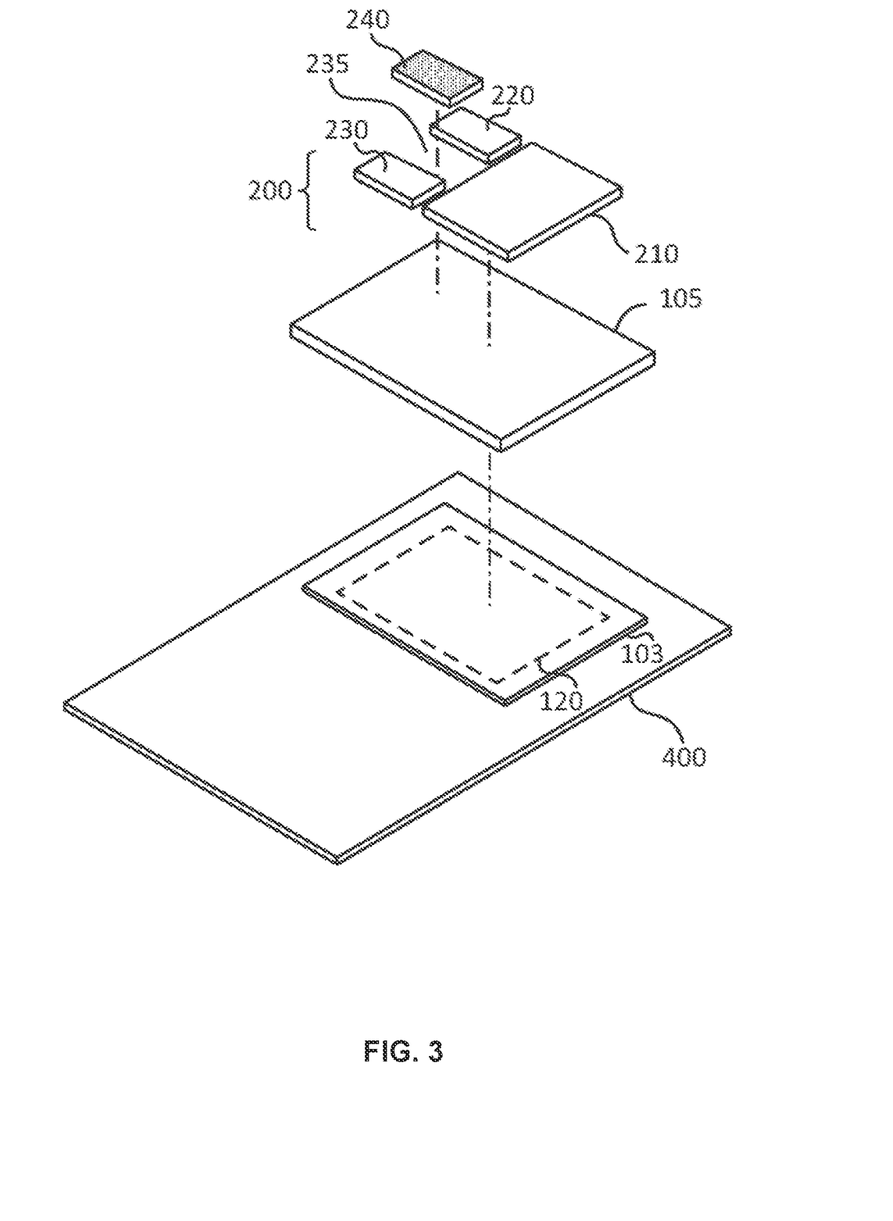
FIG. 3 illustrates an exploded assembly view of elements of a semiconductor package in accordance with various embodiments.
Figure 4:
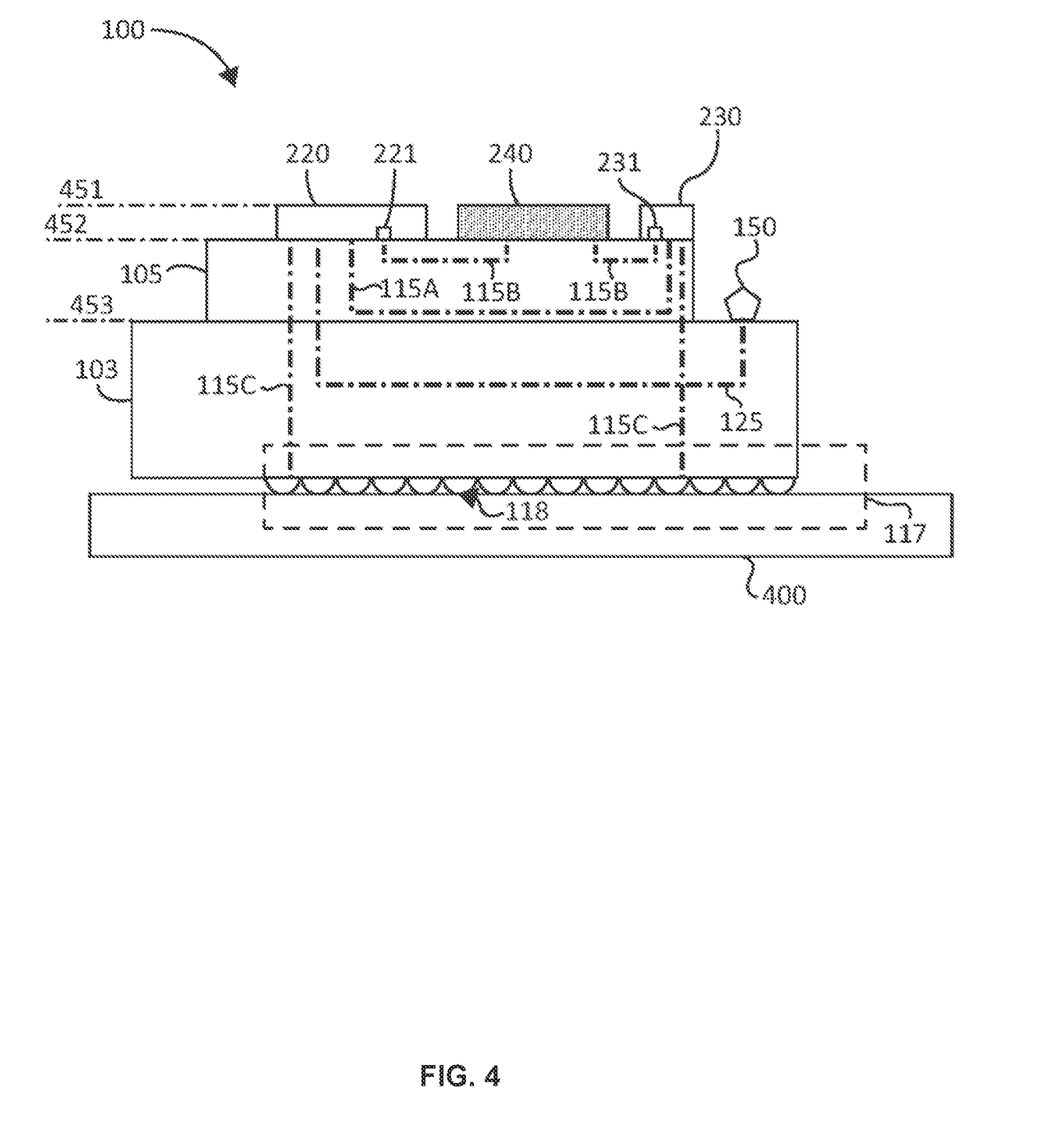
FIG. 4 illustrates a cross-sectional side view showing interconnections between different dice, interposer, and substrate in accordance with various embodiments.

FIG. 3 illustrates an exploded view of an example of the semiconductor package 100. FIG. 3 is depicted with a substrate 103, an interposer 105, the dice 200 (e.g., individually referred as 210, 220, and 230), and the capacitance die 240, although other combinations of fewer, more, or different elements may be utilized. In use, the package 100 may be borne by a circuit board 400 (such as a motherboard) or otherwise contained within a computer assembly or a server assembly, for example. A side cross-section view of the semiconductor package 100 is illustrated in FIG. 4 and shows examples of interconnections that may be present between different components of the semiconductor package 100.

Referring to FIG. 3, the substrate 103 can correspond to suitable structure for receiving other components. The substrate 103 may be the substrate portion of a COWOS assembly, for example. The substrate 103 may include silicon, fiberglass, or other suitable organic or non-organic materials. The substrate 103 can include connections sized on a micro-meter scale or otherwise suitably sized for connection with the interposer 105.

The interposer 105 may include a suitable body with elements that can allow connection between combinations of the substrate 103, the dice (e.g., 210, 220, 230, etc.), and/or the capacitance die 240. In some embodiments, the capacitance die 240 may be connected to the other dice through the interposer 105. However, the present disclosure is not limited to connecting the capacitance die 240 through the interposer 105, and other ways of connecting the capacitance die 240 are possible. For example, the capacitance die 240 can be connected to another die 200 or multiple other dice 200 through the substrate 103.

The interposer 105 may be the wafer portion of a COWOS assembly, for example. The interposer 105 may include silicon, fiberglass, or other suitable organic or non-organic materials. The interposer 105 may include suitable features for spreading a connection from the dice to a wider pitch for interoperability with the substrate 103, from the capacitance die 240 to other dice, and/or from the capacitance die 240 to a wider pitch for interoperability with the substrate 103. In some examples, the interposer 105 on an upper side includes connections sized on a nano-meter scale for connection with the die (e.g., 210, 220, 230) and/or the capacitance die 240, and on a lower side includes connections sized on a micro-meter scale for connection with the substrate 103. The different scales of connections may be coupled via tracings or other suitable structures extending within the interposer 105, for example.

At least one die of 210, 220, and/or 230 may be included on the interposer 105. The die or dice may be the chip portion of a COWOS assembly, for example. Although the interposer 105 is shown with dice 210, 220, and 230 (and with the capacitance die 240) by way of example, other arrangements are possible (e.g., see FIG. 7). Any suitable number dice may be utilized, including one, two, three, or more than three. Any suitable type of dice can be utilized individually or in combination. Examples of suitable types of dice can include any type of integrated circuit, for example, memory dice, compute dice, logic dice, accelerators, and application-specific integrated circuits (ASICs). The die can include connection features at a specific scale suitable for engaging the interposer 105. For example, the die can include connections sized on a nano-meter scale or otherwise suitably sized for connection with the interposer 105.

FIG. 4 illustrates a side view of the package 100. The package 100 can include suitable features to facilitate interoperability of components within the package 100 with each other and/or with components external to the package 100. FIG. 4 also illustrates a side view of example planes about which coplanarity of the components within the package 100 can be enhanced by filling gaps with the capacitance die 240. In various examples, using capacitance die 240 not only enhances coplanarity, but also enhances operational performance by providing additional capacitance through connections with the dice 220 and/or 230.

Suitable pathways may be formed using traces (of copper or other material), vias, or other suitable structures. Various types of pathways are shown schematically with dot-dash lines by way of example in FIG. 4, although other combinations of fewer, more, or different routings may be utilized. Examples of interconnections between the dice 220 and 230, the capacitance die 240, the interposer 105, and the substrate 103 are explained as follows.

In some embodiments, the interposer 105 includes multiple types of interconnections For example, a first set of interconnections (e.g., 115A) can connect the plurality of dice 200 (e.g., the dice 210, 220, and 230), and a second set of interconnections (e.g., 115B) can connect the capacitance die 240 (or 300) to the plurality of dice 200. The interposer 105 may be arranged between the substrate 103 and the plurality of dice 200 such that the first set of interconnections (e.g., 115A) connect the plurality of dice 200. Also, the interposer 105 may be arranged between the substrate 103 and the capacitance die 240 such that the second set of interconnections (e.g., 115B) connect the capacitance die 240 with the plurality of dice 200.

The interconnections between the plurality of dice 200 such as between dies 210 and 220, between dies 210 and 230, and/or between 220 and 230 may be collectively referred as a first set of connections 115A. Another set of interconnections between the capacitance dice 240 and the plurality of dice 200 such as between 240 and 210, between 240 and 220, and/or between 240 and 230 may be collectively referred as a second set of connections 115B. In some embodiments, the interconnections are isolated from each other to avoid signal or noise interference.

As depicted in FIG. 4, an electrical pathway 115A may connect the second die 220 and the third die 230 through the interposer 105 as a portion of the first set of interconnections. Similar pathway 115A may connect the first die 210 and the second die 220, and/or the first die 210 and the third die 230, although not illustrated in FIG. 4. It can be understood that all the instances of the interconnections 115A may be present or some instances of 115A may be omitted depending on the semiconductor package design. The present disclosure is not limited to connection between particular dice.

As also depicted in FIG. 4, an electrical pathway 115B connects the capacitance die 240 and the second die 220 through the interposer 105. For example, the electrical pathway 115B may electrically connect to a power domain 221 of the second die 220 for supplying voltage from one or more capacitors (e.g., a first set of capacitors) of the capacitance die 240. In some embodiments, the electrical pathway 115B may be connected to power rails (not illustrated) used by the power domain 221 to supply voltage and current to the second die 220 according to power specification of the second die 220.

Another electrical pathway 115B is depicted as connecting the capacitance die 240 and the third die 230. For example, said electrical pathway 115B may electrically connect to a power domain 231 of the third die 230 for supplying voltage from another one or more capacitors (e.g., a second set of capacitors) of the capacitance die 240. In some embodiments, the electrical pathway 115B may be connected to power rails (not illustrated) used by the power domain 231 to supply voltage and current to the third die 230 according to power specification of the third die 230. The electrical pathway 115B have low resistance and/or impedance compared to an electrical pathway between capacitors outside the die area and the plurality of dice (e.g., 220, 230). As such, the pathway 115B can facilitate reduction of high-frequency noise during high speed computation.

It can be understood that all the instances of the interconnections 115B may be present or some instances of 115B may be omitted depending on a capacitance specification for each die of the semiconductor package. The present disclosure is not limited to connection between particular dice.

The respective connections and/or segments within the electrical pathways 115A and/or 115B may be sufficiently low loss to permit connection among respective dice (such as connection of the third die 230 to the second die 220) and/or connection between the capacitance die 240 and other dice (such as connection of the capacitance die 240 to the second die 220 and/or third die 230) through the interposer 105 and/or the substrate 103.

As discussed herein, a given interposer 105 may include portions of one or more electrical pathways (e.g., 115A, 115B) or other suitable structure for connecting components of a same level of the package 100 (e.g., for connection among dice each borne by the same interposer 105). The pathways among components on a same level may be present in addition to one or more portion of pathways through the interposer 105 that may be present for providing connection among components at different levels. For example, in addition to the pathways 115A and 115B for same-level connections, the interposer 105 in FIG. 4 is also shown with pathways 115C (e.g., for connection among the dice 210, 220, and 230 over the interposer 105 and the substrate 103, motherboard 400, or other elements below the interposer 105).

The substrate 103 may further include a suitable interface 117 for connection to other components. Although the interface 117 is schematically depicted as a functional block, suitable examples of the structures of the interface 117 may include connectors (e.g., Peripheral Component Interconnect Express (PCIE) or another variety of connector) and/or a ball grid array (BGA) 118 or other type of mounting arrangement. The interface 117 may provide connection to cables and/or a motherboard 400, for example. Moreover, although the interface 117 is schematically depicted as arranged along an underside of the substrate 103, the interface 117 additionally may include structures along a top side or other portion of the substrate 103. A suitable electrical pathway 115C may extend from the interface 117 through the substrate 103 for connection to other components. For example, portions of the electrical pathway 115C from the interface 117 of the substrate 103 may extend through the interposer 105 and/or through or into a given die 210, 220, and 230. The electrical pathways herein may be isolated from each other. For example, the electrical pathway 115C is isolated from the pathway 125 (discussed further below).

FIG. 4 also illustrates coplanarity between components. The coplanarity may be affected if there are large gaps between dice, which may make the semiconductor package 100 susceptible to mechanical warpage of the substrate, the interposer and/or other components, during an assembly process or during use of the semiconductor package. In some embodiments, the semiconductor package 100 may include the capacitance die 240 that enhances the coplanarity by filling the gaps.

As shown, the coplanarity of the semiconductor package 100 may be characterized by different planes. In some embodiments, a first plane 451 includes top surfaces of the dice 220, 230 and 240. In some embodiments, a second plane 452 includes bottom surfaces of the dice 220, 230 and 240, or a top surface of the interposer 105. In some embodiments, a third plane 453 includes the bottom surfaces of the interposer 105. For example, if there are large gaps greater than 100 μm (e.g., greater than 2 mm, 5 mm, etc.) between dice, during an installation process, the interposer 105 may get distorted. In some embodiments, the electrical pathways connect at the planes (e.g., planes 452 and 453) with components above. For example, the electrical pathway 115C may be created by connection between the substrate 103, the interposer 105, and the dice 200. The coplanarity may ensure the electrical pathways 115A, 115B, and 117 are seamlessly connected. Thus, the coplanarity facilitated by the capacitance die 240 may resist, reduce, and/or prevent mechanical warpage, which could otherwise break the electrical pathways and affect the function of the semiconductor package.

In some embodiments, the dice and the interposer may be connected via micro bumps (not illustrated). Accordingly, in some embodiments, the micro bumps may serve as reference points, which may be desirable to be within the same plane to ensure coplanarity.

As discussed above, the capacitance die 240 may enhance coplanarity of the package 100 to facilitate suitable connections. In addition, the capacitance die 240 may facilitate a low resistance and/or a low impedance for connections. Also, a shorter length of connections with the one or more dice of the plurality of dice 200 can be achieved compared to a length of connections with capacitors (e.g., 150 in FIG. 1) located outside a die area (e.g., 120 in FIG. 2). For example, as shown in FIG. 4, an instance of a capacitor 150 is connected to a die 220 by an electrical pathway 125 that passes from the capacitor 150 through the substrate 103 through the interposer 105 to the die 220. As such, the length of the pathway 125 associated with a typical capacitor on the semiconductor package 100 is longer than the pathway 115B facilitated by the capacitance die 240.

Figure 5:
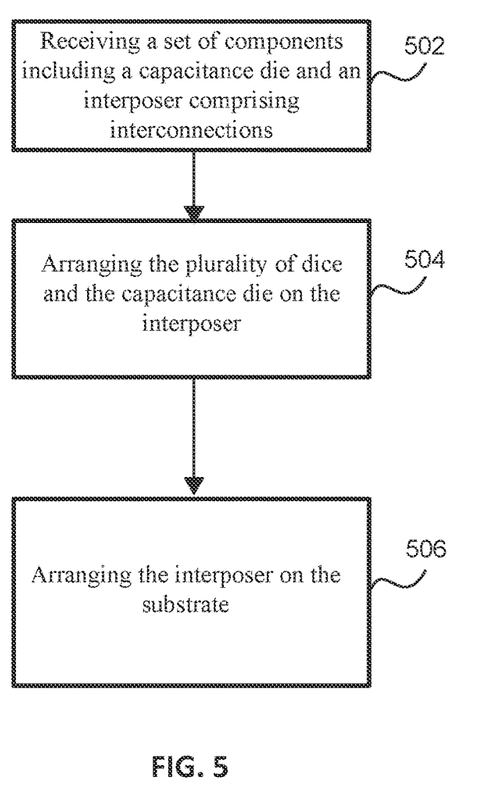
FIGS. 5 and 6 illustrate a method of assembly of a semiconductor package in accordance with various embodiments.
Figure 6:
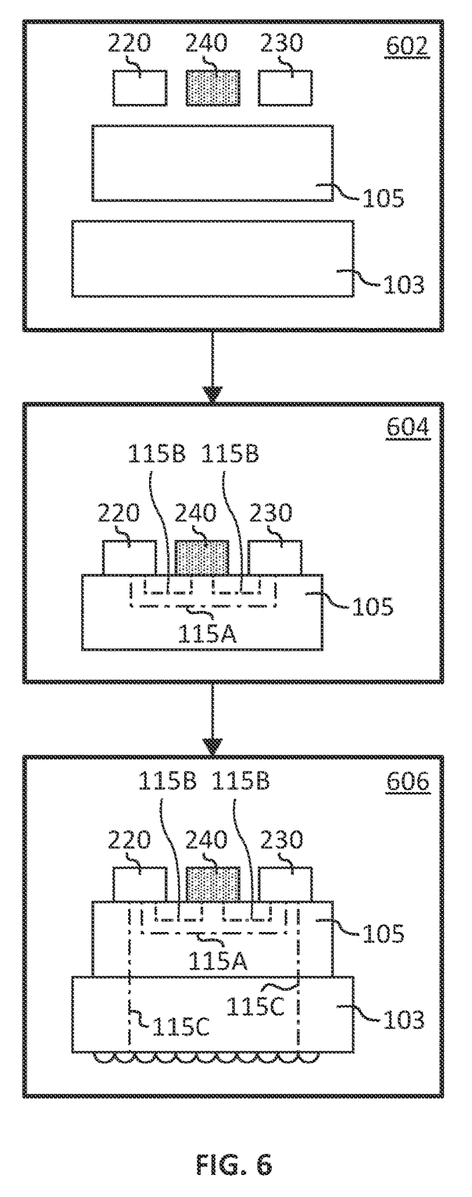

FIG. 5 is a flow diagram depicting an example process 500, and FIG. 6 illustrates various examples of components that may be implemented in that process 500. Various blocks of the process 500 are described by referencing blocks 602 through 606 of FIG. 6, however, additional and/or alternative components may be used with the process 500. Some or all of the components in FIG. 6 can be examples of components from FIGS. 1-4 of similar name and reference numeral, although additional and/or alternative components may be used.

The process 500 at block 502 can include receiving a set of components to assemble a semiconductor package. In some embodiments, the components include a substrate (e.g., 103), a plurality of dice (e.g., 210, 220, and 230) with one or more dice including at least one power domain, a capacitance die (e.g., 240), and an interposer (e.g., 105) including interconnections such as a first set of interconnections and a second set of interconnections (e.g., as illustrated in FIG. 4). As previously discussed, the capacitance die (e.g., 240) may include an capacitor array. The components can be assembled within a pre-determined area (e.g., die area 120). For example, as shown in FIG. 6 at block 602, components including dice 220 and 230, a capacitance die 240, a substrate 103, and an interposer 105 may be received, although other combinations may be received additionally or alternatively.

Referring back to FIG. 5, the process 500 at block 504 can include arranging the plurality of dice and the capacitance die on the interposer. In some embodiments, the arranging involves establishing the first set of interconnections to connect the plurality of dice. In some embodiments, the arranging involves establishing the second set of interconnections to connect the capacitance die to one or more of the plurality of dice. In some embodiments, the block 504 can include arranging a first die of the plurality of dice at a first location on the substrate, a second die of the plurality of dice at a second location of the substrate, and a third die of the plurality of dice at a third location of the substrate.

For example, as shown in FIG. 6 at block 604, the second die 220 may be arranged at a left end of the interposer 105 and the third die 230 may be arranged at a right end of the interposer 105. Once arranged, a connection 115A may be established between the second die 220 and/or the third die 230 through the interposer 105. The capacitance die 240 may be arranged between the dice 220 and 230 on the interposer 105. The capacitance die 240 may be arranged such that interconnections 115B are established through the interposer 105. For example, one interconnection 115B may be established between the second die 220 and the capacitance die 240, and/or another interconnection 115B may be established between the third die 230 and the capacitance die 204. The capacitance die 240 may be sized to facilitate the coplanarity with dice 220 and 230. The interconnections 115B may supplement the power domains of the dice 220 and 230 with additional capacitance through the capacitors of the capacitance die 240. Once the interconnections 115B are established, a first voltage from a first set of capacitors of the capacitance die 240 may be supplied to the second die 220, and a second voltage from a second set of capacitors of the capacitance die 240 may be supplied to the third die 230.

In addition, a portion of interconnection 115C (see block 606) may be established between the second die 220 and the interposer 105. Alternatively or in addition, another portion of interconnection 115C may be established between the third die 230 and the interposer 105.

Referring back to FIG. 5, the process 500 at block 506 can include arranging the interposer 105 on the substrate 103. In an example shown in FIG. 6 at blocks 606, the interposer 105 may be stacked on the substrate 105 within a die area (e.g., 120 in FIG. 1). In some embodiments, the interposer 105 may be stacked on the substrate 103 such that interconnections 115C extends from the second die 220 and/or the third die 230 all the way through the interposer 105 to a bottom or other portion of the substrate 103.

The semiconductor package or another semiconductor package may also include another die area within which another set of dice with a placeholder die may be disposed in an extra space between the dice. The placeholder die(s) may be configured to provide structural integrity and facilitate coplanarity of the semiconductor package. However, such placeholder die(s) may lack the ability to provide any operational benefits associated with computational efficiency of the semiconductor package. Thus, in some embodiments, replacing a placeholder die with a capacitance die in a semiconductor package design process may provide additional operational benefits while maintaining or providing additional structural integrity benefits.

For arranging the placeholder die, in some embodiments, the process 500 may further include receiving a second substrate. A second plurality of dice that can be arranged on the second substrate, for example, through a second interposer. On the second interposer, a placeholder die may be arranged among the second plurality of dice, as opposed to a capacitance die. As discussed herein, the placeholder die may facilitate coplanarity, but is not electrically connected to the second plurality of dice to provide any operational benefits.

It can be understood that the process 500 is not limited to the sequence of arrangement of different components to build the semiconductor package. In some embodiments, one or more steps may be combined, or omitted. For example, the plurality of dice may be arranged on the interposer, followed by arranging the interposer on the substrate, and then arranging the capacitance die on the substrate. In some embodiments, the interposer may be arranged on the substrate, followed by arranging the plurality of dice and the capacitance die on the interposer. In some embodiments, the interposer may be omitted.

Figure 7:
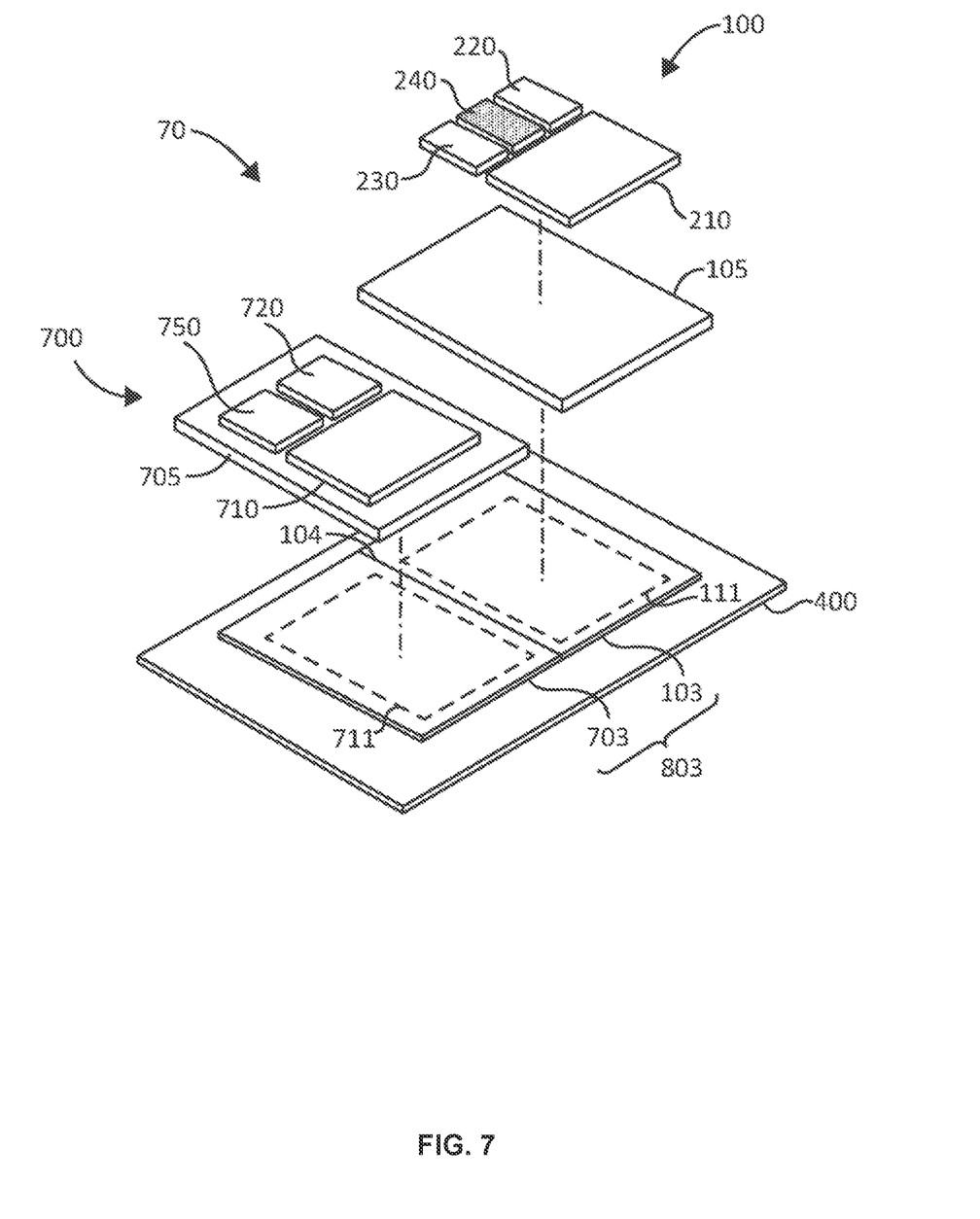
FIG. 7 illustrates another example of a combined semiconductor package including two semiconductor packages arranged on a motherboard, in accordance with various embodiments.

FIG. 7 illustrates an example configuration of a combined semiconductor package 70 comprising a first semiconductor package similar to the package 100 and a second semiconductor package 700. Within the second semiconductor package 70, components such as substrates, interposers and dice may be sized such that multiple corresponding semiconductor packages can fit on a mother board 400.

As discussed above, a first semiconductor package 100 may include a first set of computational dice 200 (e.g., individually referred as 210, 220, and 230) electrically coupled to the capacitance die 240, such as through a first interposer 105 and/or the substrate 103 (e.g., as discussed with respect to FIG. 4). The first interposer 105 may be mounted on the substrate 103 and an electrical pathway between the dice 200 and the first substrate 103 may be established (e.g., as discussed with respect to FIG. 4). The first set of dice 200, the capacitance die 240, and the first interposer 105 may be sized to fit within a die area 111 on the first substrate 103. The first substrate 103 may be sized to fit within a first portion (e.g., a right half) of the motherboard 400.

In some embodiments, the second semiconductor package 700 may include a second set of computational dice 710 and 720, and a placeholder die 750 arranged on a second interposer 705. The second interposer 705 may be further mounted on a second substrate 703. Similar to the first package 100, the second set of dice 710 and 720 may be electrically coupled through the interposer 705 and further electrically coupled to the second substrate 703. However, unlike the capacitance die 240, the placeholder die 750 is not electrically coupled to any of the dice 710 or 720, the second interposer 705, or the second substrate 703. The second set of computational dice 710 and 720, the placeholder die 750, and the second interposer 705 may be sized to fit within a die area 711 on the second substrate 703. The second substrate 703 may be sized to fit within a second portion (e.g., a left half) of the motherboard 400.

In some embodiments, the first substrate 103 and the second substrate 703 may be positioned adjacent to each other at a boundary line 104 on the motherboard 400. For example, the substrates 103 and 703 may be separate but abutted or otherwise distinct along the boundary line 104.

In some embodiments, the substrates 103 and 703 may be a unitary substrate 803, e.g., integrally formed from a single monolithic mass of material. In this case of a unitary substrate, the boundary line 104 may be absent. The unitary substrate 803 can include different regions. For example, a first region 111 and a second region 711. Although two regions are depicted, any number of regions may be included, including one, two, or more than two. The regions may be arranged to be non-overlapping relative to one another.

The number of regions on a unitary substrate 803 may facilitate receipt of a corresponding number of semiconductor packages. Each semiconductor package can include a respective interposer 105, a respective capacitance die 240 or a respective placeholder die 750, and dice 200, for example. The semiconductor packages may be identical or different from one another, e.g., including identical and/or different interposers 105, capacitance die or dice 240, and/or dice 200. For example, the interposers 105 and 705 may be identical, or they may have different sizes and/or shapes. In some embodiments, the first semiconductor package (e.g., 100) including a capacitance die 240 and the dice 200, and the second semiconductor package (e.g., 700) including a placeholder die 750 and the dice 200 may be mounted in the same plane to be coplanar.

Respective semiconductor packages (e.g., 100 and 700) may be received in respective regions (e.g., 111 and 711) of the substrate 803. An electrical pathway (not illustrated) may be created through the unitary substrate 803 to connect dice of different semiconductor packages. For example, the unitary substrate 803 may include interconnections to facilitate connections between a die (e.g., 210) of the first semiconductor package (e.g., 100) and a die (e.g. 710) of the second semiconductor package (e.g., 700). Such interconnections can pass through respective substrates of the respective semiconductor packages to connect the dies of different packages. In some embodiments, interconnections may be provided that permit the capacitance die 240 from one package (e.g., 100) to supply power to a die or multiple dice in another package (e.g., 700).

Use of the compound packages 80 in a system such as a computer system or a server system may provide various benefits compared to use of solely singular packages. Space savings may be achieved. Additionally or alternatively, use of the compound packages 800 may obviate and/or reduce an amount of components that may be utilized for connection in the computer system or the server system. Reduction in such components may provide savings in terms of space, complexity, materials, installation, maintenance, or other criteria, for example.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A computer assembly, comprising:
a motherboard; and
a semiconductor package borne by the motherboard, the package comprising:
a substrate mounted on the motherboard;
a plurality of dice mounted on the substrate, the plurality of dice including a first die, a second die, and a third die distributed such that the second die and the third die are separated by an extra space, the extra space disrupting a coplanarity of the semiconductor package, each die of the plurality of dice comprising at least one power domain; and
a capacitance die located in the extra space so as to establish the coplanarity of the plurality of dice, the capacitance die comprising a capacitor array electrically coupled to multiple power domains of the plurality of dice.

2. The computer assembly of claim 1, further comprising: a second semiconductor package with a placeholder die that is not electrically coupled to any of the plurality of dice, wherein the second semiconductor package is borne by the motherboard.

3. The computer assembly of claim 1, wherein the plurality of dice are mounted on the substrate via an interposer positioned between the plurality of dice and the substrate, wherein the capacitance die is connected to the plurality of dice via the interposer.

4. The computer assembly of claim 1, wherein the capacitance die comprises: a first capacitor having a first capacitance value and a second capacitor having a second capacitance value, the first capacitance value being different from the second capacitance value.

5. The computer assembly of claim 4, wherein the first capacitor, the second capacitor, or both are connected to a power domain of the first die, the second die, or both the first die and the second die.

6. The computer of claim 4, wherein the first capacitor is a first element of the capacitor array and the second capacitor is a second element of the capacitor array.

7. A semiconductor package, comprising:
a substrate;
a plurality of dice mounted on the substrate such that an extra space exists among the plurality of dice on the substrate; and
a capacitance die located in the extra space so as to enhance coplanarity of the semiconductor package, wherein the capacitance die is electrically coupled to one or more dice of the plurality of dice.

8. The semiconductor package of claim 7, wherein each die of the plurality of dice comprising at least one power domain, wherein the capacitance die comprises a capacitor array electrically coupled to multiple power domains of the plurality of dice.

9. The semiconductor package of claim 8, wherein the plurality of dice are mounted on the substrate via an interposer positioned between the plurality of dice and the substrate.

10. The semiconductor package of claim 9, wherein the capacitance die is connected to the plurality of dice via the interposer.

11. The semiconductor package of claim 8, wherein capacitors of the capacitor array are decoupled from each other, and wherein connections between the capacitors and the multiple power domains have an impedance low enough to block high frequency noise generated during operation.

12. The semiconductor package of claim 11, wherein a first capacitor of the capacitor array has a first capacitance value different from a second capacitance value of a second capacitor of the capacitor array.

13. The semiconductor package of claim 8, wherein the capacitance die comprises: a first set of capacitors configured to satisfy a first voltage specification of a first die of the plurality of dice, and a second set of capacitors configured to satisfy a second voltage specification of a second die of the plurality of dice.

14. The semiconductor package of claim 8, wherein the capacitance die facilitates a shorter length of connections with the one or more dice of the plurality of dice compared to a length of connections with capacitors located outside a die area covered by the plurality of dice and the extra space.

15. The semiconductor package of claim 8, wherein the plurality of dice comprise:
   a first die of a first size;
   a second die of a second size positioned adjacent to the first die; and
   a third die of a third size positioned adjacent to the first die, wherein the extra space is located between the second die and the third die.

16. The semiconductor package of claim 15, wherein the second die and the third die have same size smaller than the first size of the first die.

17. A method, comprising:
   receiving a set of components that comprises:
   a substrate;
   a plurality of dice with each die comprising at least one power domain;
   a capacitance die, the capacitance die comprising a capacitor array; and
   an interposer comprising interconnections, the interconnections comprising a first set of interconnections and a second set of interconnections;
   arranging the plurality of dice and the capacitance die on the interposer, the capacitance die being disposed between two dice of the plurality of dice, the first set of interconnections connecting the plurality of dice and the second set of interconnections connecting the capacitor array with the multiple power domains of the plurality of dice; and
   arranging the interposer on the substrate.

18. The method of claim 17, further comprising:
   arranging a first die of the plurality of dice at a first location on the interposer, a second die of the plurality of dice at a second location of the interposer, and a third die of the plurality of dice at a third location of the interposer; and
   arranging the capacitance die between the second die and the third die such that the first die, the second die, the third die, and the capacitance die are adjacent to each other.

19. The method of claim 18, further comprising:
   receiving a second substrate;
   arranging a second plurality of dice on the second substrate; and
   arranging a placeholder die among the plurality of dice, the placeholder die not electrically connected to the second plurality of dice.

20. The method of claim 17, further comprising:
   supplying a first voltage from a first set of capacitors of the capacitance die to a first die of the plurality of dice; and
   supplying a second voltage from a second set of capacitors of the capacitance die to a second die of the plurality of dice.

* * * * *

UNITED STATES PATENT AND TRADEMARK OFFICE
CERTIFICATE OF CORRECTION

PATENT NO. : 12,132,028 B2
APPLICATION NO. : 17/698976
DATED : October 29, 2024
INVENTOR(S) : Bassam Abdel-Dayem et al.

Page 1 of 1

It is certified that error appears in the above-identified patent and that said Letters Patent is hereby corrected as shown below:

In the Claims

Column 14, Line 29, Claim 6:
Delete: "The computer of claim 4, wherein the first capacitor is"
Insert --The computer assembly of claim 4, wherein the first capacitor is--

Signed and Sealed this
Sixteenth Day of September, 2025

Coke Morgan Stewart
*Acting Director of the United States Patent and Trademark Office*